(12) United States Patent
Chun

(10) Patent No.: US 7,271,087 B2
(45) Date of Patent: Sep. 18, 2007

(54) DUAL DAMASCENE INTERCONNECTION IN SEMICONDUCTOR DEVICE AND METHOD FOR FORMING THE SAME

(75) Inventor: In-Kyu Chun, Yeoju-kun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 189 days.

(21) Appl. No.: 11/024,657

(22) Filed: Dec. 30, 2004

(65) Prior Publication Data

US 2005/0142862 A1 Jun. 30, 2005

(30) Foreign Application Priority Data

Dec. 31, 2003 (KR) .................. 10-2003-0101809

(51) Int. Cl.
*H01L 21/4763* (2006.01)
(52) U.S. Cl. .................. 438/622; 438/628; 438/634
(58) Field of Classification Search ................ 438/622, 438/628, 634
See application file for complete search history.

(56) References Cited

U.S. PATENT DOCUMENTS

2001/0049195 A1 12/2001 Chooi et al.

2005/0263892 A1* 12/2005 Chun .................. 257/751

FOREIGN PATENT DOCUMENTS

JP 2000-91429 3/2000

* cited by examiner

*Primary Examiner*—M. Wilczewski
*Assistant Examiner*—Pamela E Perkins
(74) *Attorney, Agent, or Firm*—Lowe Hauptman Ham & Berner LLP

(57) ABSTRACT

A dual damascene interconnection in a semiconductor device is formed to be capable of preventing fluorine (F) component from being diffused through sidewalls of a via hole and a trench. The dual damascene interconnection includes a lower metal interconnection film, an intermetal insulating film having a via hole and a trench and formed on the lower metal interconnection film, first and second insulative spacer films formed on sidewalls of the via hole and the trench, respectively, a barrier metal layer covering the first and second insulative spacer films and the lower metal interconnection film in the via hole and the trench, and an upper metal interconnection film formed on the barrier metal layer, the via hole and the trench being filled with the upper metal interconnection film.

4 Claims, 3 Drawing Sheets

DUAL DAMASCENE INTERCONNECTION IN SEMICONDUCTOR DEVICE AND METHOD FOR FORMING THE SAME

BACKGROUND OF THE INVENTION (a) Field of the Invention

The present invention relates to an interconnection in a semiconductor device and a method for forming the same, and more particularly to a dual damascene interconnection in a semiconductor device and a method for forming the same.

(b) Description of the Related Art

In fabricating a semiconductor device using a design rule of below 0.13 μm for high integration, a copper interconnection formed by dual damascene is being widely used. With the copper interconnection, a material having a low dielectric constant, such as a fluoro-silicate glass (FSG) film, is used as an intermetal insulating film. In this case, fluorine (F) contained in the FSG film may raise several problems, which will be described in detail with reference to the accompanying drawings below.

FIG. 1 is a sectional view illustrating a dual damascene interconnection in a conventional semiconductor device.

Referring to FIG. 1, an intermetal insulating film 130 including a FSG film 132 is formed on a lower metal interconnection film 110 composed of a copper film and disposed in a lower insulating film 100. The intermetal insulating film 130 includes a lower capping layer 131 and an upper capping layer 133, with the FSG film 132 interposed therebetween, each of which is composed of an undoped silicon glass (USG) film.

A via hole 141 penetrates through the intermetal insulating film 130 and an etch stop film 120 to expose the lower metal interconnection film 110, and a trench 142 having a width wider than that of the via hole 141 is formed on the via hole 141. A barrier metal layer 150 composed of a Ta/TaN film is formed on sidewalls of the via hole 141 and the trench 142 and on an exposed surface of the lower metal interconnection film 110. In addition, an upper metal interconnection film 160 with which the via hole 141 and the trench 142 are completely filled is formed on the barrier metal layer 150.

In the above-described dual damascene interconnection, the lower capping layer 131 and the upper capping layer 133 are formed in order to prevent the fluorine component of the FSG film 132 from diffusing to the upper and lower layers that sandwich the FSG file 132 therebetween. However, as recognized by the present inventor, the FSG film 132 and the barrier metal layer 150 directly contact each other on a sidewall of the FSG film 132, or sidewalls of the via hole 141 and the trench 142. Accordingly, there may arise a problem of adhesion between the FSG film 132 and the barrier metal layer 150. More specifically, when the concentration of fluorine (F) component is increased in order to further lower a dielectric constant, the adhesion between the FSG film 132 and the barrier metal layer 150 is deteriorated, which may result in a peeling phenomenon, thus lowering the reliability of the semiconductor device.

In addition, when the above described dual damascene interconnection is formed, the FSG film 132 may be exposed to the air through the via hole 141 and the trench 142. In this case, the fluorine (F) component contained in the FSG film 132 reacts with water in the air to thereby form SiOF on a surface of the lower metal interconnection film 110. SiOF creates an undesired silicon oxide film in a subsequent thermal process. In the presence of this silicon oxide film, when the barrier metal layer 150 is formed, a low electrical resistance contact between the barrier metal layer 150 and the lower metal interconnection film 110 may not be effectively made due to the presence of a native silicon oxide film.

SUMMARY OF THE INVENTION

In consideration of the above-identified and other problems of conventional devices and methods, it is an object of the present invention to provide a dual damascene interconnection in a semiconductor device, which is capable of preventing a fluorine (F) component contained in a FSG film used as an intermetal insulating film from diffusing through sidewalls of a via hole and a trench.

It is another object of the present invention to provide a method for forming such a dual damascene interconnection.

To achieve these objects, according to an aspect of the present invention, there is provided a dual damascene interconnection in a semiconductor device, including:

a lower metal interconnection film;

an intermetal insulating film having a via hole and a trench and formed on the lower metal interconnection film;

first and second insulative spacer films formed on sidewalls of the via hole and the trench, respectively;

a barrier metal layer covering the first and second insulative spacer films and the lower metal interconnection film in the via hole and the trench; and an upper metal interconnection film formed on the barrier metal layer, the via hole and the trench being filled with the upper metal interconnection film.

Preferably, the lower and upper metal interconnection films are formed with a copper film.

Preferably, the intermetal insulating film has a stacked structure where a lower capping layer, an insulating film having a low dielectric constant, and an upper capping layer are stacked sequentially.

Preferably, the lower and upper capping layers are formed with an USG film, and the insulating film having a low dielectric constant is formed with a FSG film.

Preferably, the first and second insulative spacer films are formed with an USG film, and the barrier metal layer is formed with a Ta/TaN film.

According to another aspect of the present invention, there is provided a method for forming a dual damascene interconnection in a semiconductor device, including the steps of:

forming an etch stop film and an intermetal insulating film sequentially on a lower metal interconnection film;

forming a via hole to expose the etch stop film on the intermetal insulating film by performing an etching process using a mask pattern for via hole formation;

forming a trench by performing an etching process using a mask pattern for trench formation;

forming an insulating film on an exposed surface of the etch stop film and a surface of the intermetal insulating film;

forming first and second insulative spacer films on sidewalls of the via hole and the trench, respectively, by performing an etching process for the insulating film, and simultaneously, exposing a portion of the etch stop film;

exposing the lower metal interconnection film by removing the exposed portion of the etch stop film;

forming a barrier metal layer on the lower metal interconnection film and the first and second insulative spacer films; and forming an upper metal interconnection film on the barrier metal layer, the via hole and the trench being filled with the upper metal interconnection film.

Preferably, the intermetal insulating film includes a FSG film. Preferably, the insulating film used to form the first and second insulative spacer films is formed with a USG film. Preferably, the USG film is formed at a maximal thickness of 300 Å. Preferably, the barrier metal layer is formed with a Ta/TaN film.

Preferably, the etching operation for the insulating film is performed using a plasma dry etching process.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings. The following embodiments may be modified in various forms, but should not be interpreted to be limited thereto.

Figure 1:
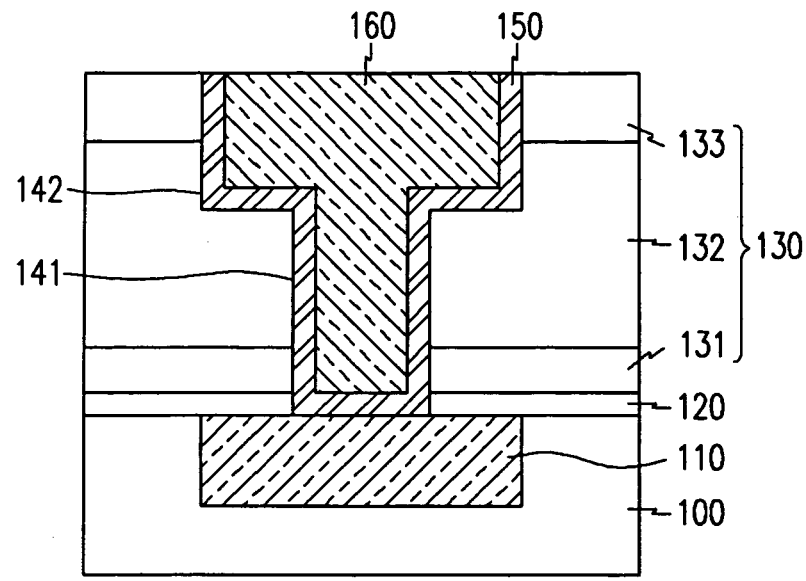
FIG. 1 is a sectional view illustrating a dual damascene interconnection in a conventional semiconductor device.
Figure 2:
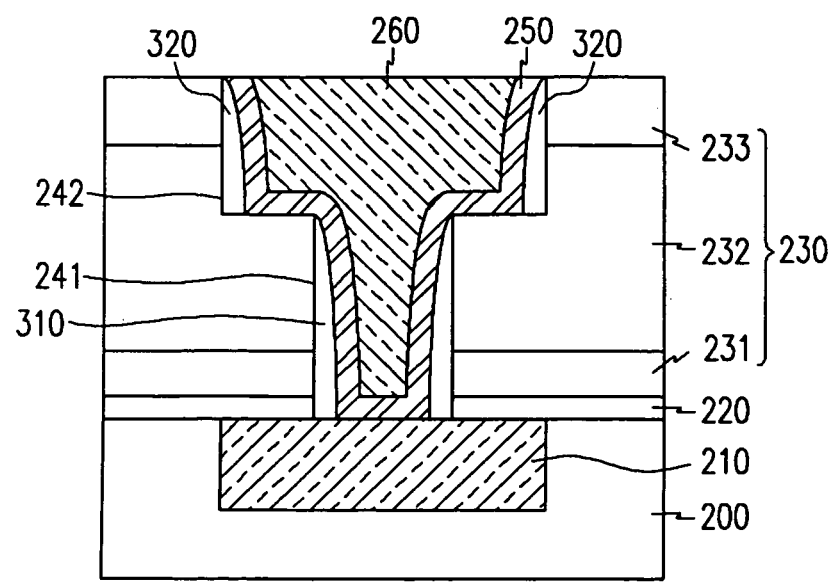
FIG. 2 is a sectional view illustrating a dual damascene interconnection in a semiconductor device according to the present invention.

FIG. 2 is a sectional view illustrating a dual damascene interconnection in a semiconductor device according to the present invention.

Referring to FIG. 2, a lower metal interconnection film 210 is formed in a lower insulating film 200. The lower insulating film may be an interlayer insulating film or an intermetal insulating film. The lower metal interconnection film 210 is formed with a copper film, and may have a simple pattern structure, as shown in the figure, or a dual damascene interconnection structure. An intermetal insulating film 230 having a via hole 241 and a trench 242 is formed on the lower insulating film 200 and the lower metal interconnection film 210. The intermetal insulating film 230 has a stacked structure where a lower capping layer 231, an insulating film 232 with a low dielectric constant, and an upper capping layer 233 are stacked sequentially. An etch stop film 220 formed with a silicon nitride film is formed between the lower capping layer 231 and the lower metal interconnection film 210.

The insulating film 232 with the low dielectric constant is formed with a FSG film, and the lower and upper capping layers 232 and 233 are formed with an USG film. First and second insulative spacer films 310 and 320 are formed on sidewalls of the via hole 241 and the trench 242, respectively. The first and second insulative spacer films 310 and 320 are also formed with an USG film. A barrier metal layer 250 covers the first and second insulative spacer films 310 and 320 and the lower metal interconnection film 210. The barrier metal layer 250 is formed with a Ta/TaN film, or may be formed with other material films in some cases. In addition, an upper interconnection film 260 formed with a copper film is formed on the barrier metal layer 250. The via hole 241 and the trench 242 are filled with the upper interconnection film 260.

In the dual damascene interconnection structure as described above, the FSG film 232 is well adhered to the barrier metal layer 250 by the first and second insulative spacer films 310 and 320 between the FSG film 232 and the barrier metal layer 250. Accordingly, the fluorine (F) component contained in the FSG film 232 can be "capped" in a lateral direction in addition to a vertical direction. The presence of the spacer films 310 and 320 assists in suppressing peeling of the barrier metal, and creation of SiOF from forming near the lower film 110. Suppressing the creation of SiOF, provides greater flexibility in performing manufacturing process steps since exposure to air does not create the same risk of oxidation at the contact region, thereby affording the manufacturing process some flexibility in the sequence and timing in which some steps are performed.

Figure 3:
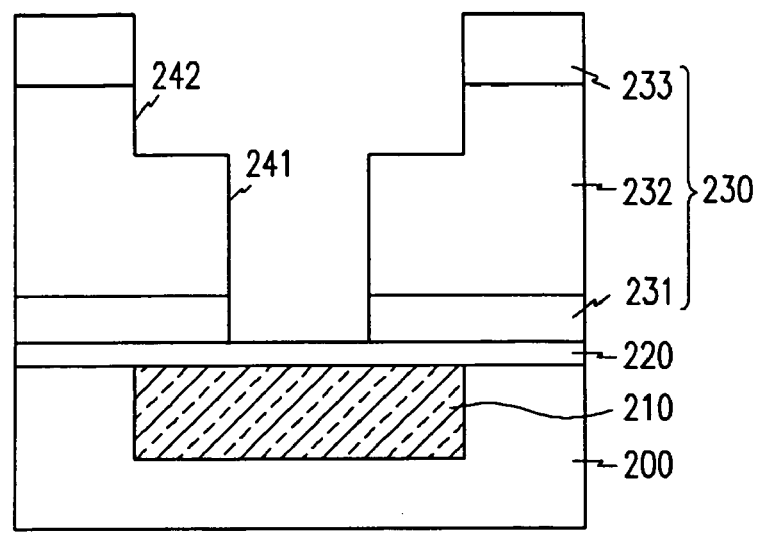
FIGS. 3 to 5 are sectional views illustrating a method for forming a dual damascene interconnection of FIG. 2.
Figure 4:
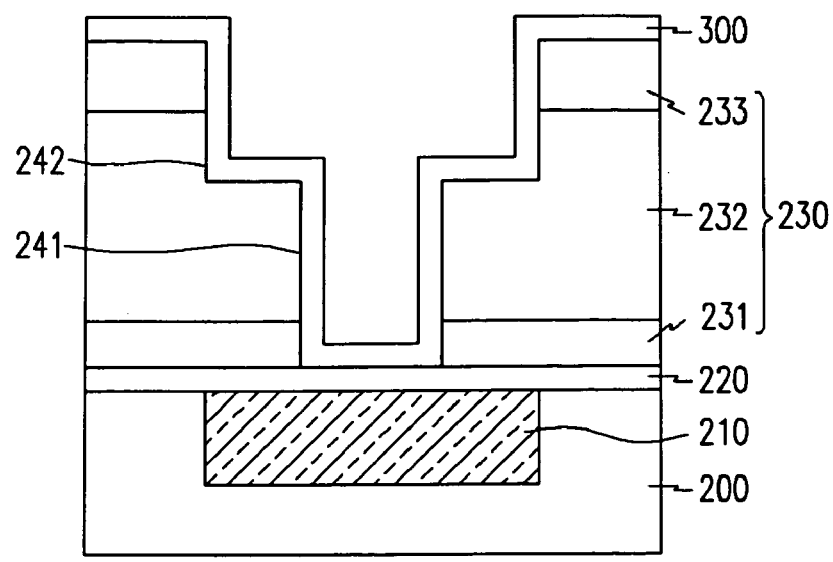
Figure 5:
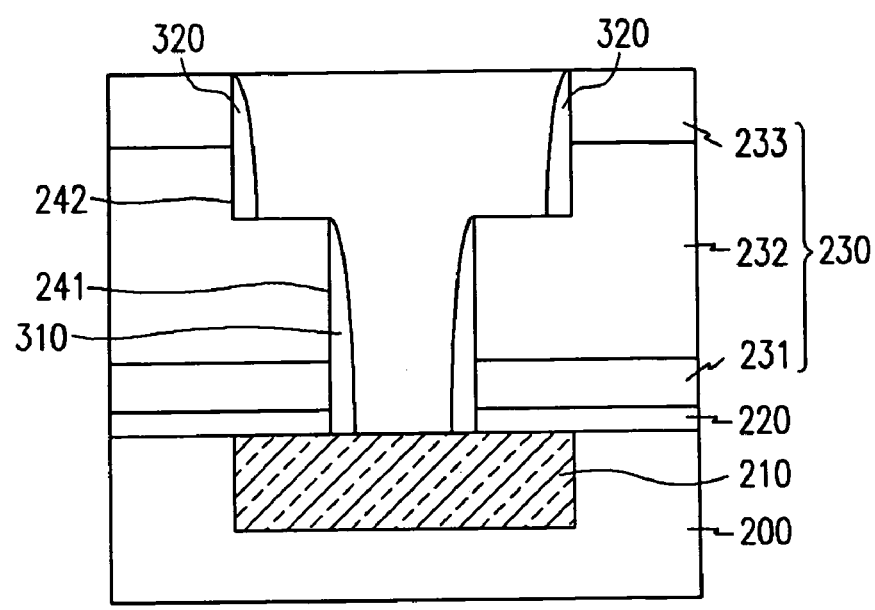

FIGS. 3 to 5 are sectional views illustrating a method for forming a dual damascene interconnection of FIG. 2.

Referring to FIG. 3, first, an etch stop film 220 and an intermetal insulating film 230 are sequentially formed on a lower metal interconnection film 210 formed in a lower insulating film 200. The lower metal interconnection film 210 is formed with a copper film, and the etch stop film 220 is formed with a silicon nitride film.

The intermetal insulating film 230 is formed by forming a lower capping layer 231 formed with an USG film, forming an insulating film 232 with a low dielectric constant and formed with a FSG on the lower capping layer 232, and forming an upper capping layer 233 formed with an USG film on the insulating film 232.

Subsequently, a via hole 241 to expose the etch stop film 220 is formed by performing an etching process using a typical mask pattern (not shown) for via hole formation, such as a photoresist film pattern. In addition, a trench 242 is formed by performing an etching process using a typical mask pattern for trench formation, such as a photoresist film pattern.

At this time, the width of the via hole 241 and the width of the trench 242 can be widened by a thickness of the first and second insulative spacer films to be formed subsequently, and accordingly, a critical dimension (CD, which is the smallest geometrical feature, such as width of interconnect line, contacts, trenches, etc., that can be formed during semiconductor device/circuit manufacturing using given technology) in a photolithography process can be increased.

Referring to FIG. 4, next, an insulating film 300 to be used to form first and second insulative films is formed on an exposed surface of the etch stop film 220 and a surface of the intermetal insulating film 230. The insulating film 300 is formed with a USG film having a maximal thickness of 300 Å.

Referring to FIG. 5, next, first and second insulative spacer films 310 and 320 are formed on sidewalls of the via hole 241 and the trench 242, respectively, by performing an etching process, for example a plasma dry etching process, for the insulating film 300.

When the first and second insulative spacer films 310 and 320 are formed, a portion of the etch stop film 220 on the lower metal interconnection film 210 is exposed.

Subsequently, as shown in FIG. 2, after exposing the lower metal interconnection film 210 by removing the exposed portion of the etch stop film 220, a barrier metal layer 250 is formed on the lower metal interconnection film 210 and the first and second insulative spacer films 310 and 320. The barrier metal layer 250 is formed with a Ta/TaN film.

Thereafter, an upper metal interconnection film 260 is formed on the barrier metal layer 250 in such a manner that the via hole 241 and the trench 250 are filled with the upper metal interconnection film 260. The upper metal interconnection film 260 is also formed with a copper film, like the lower metal interconnection film 210.

As is apparent from the above description, the dual damascene interconnection in the semiconductor device and the method for forming the same, according to the present invention, provides at least the following advantages:

First, since there is no problem of adhesion between the intermetal insulating film and the barrier metal layer, fluorine (F) concentration can be increased, which results in decrease of a dielectric constant.

Second, since the widths of the via hole and the trench can be relatively widened, the critical dimension (CD) in the photolithography process is increased, which is beneficial in securing a margin.

Third, since the sidewalls of the via hole and the trench have a relatively smooth curve, a sufficient step coverage margin can be secured when a subsequent barrier metal layer is formed.

Fourthly, since the intermetal insulating film can be prevented from being exposed to the air, via fail caused by a reaction of fluorine contained the intermetal insulating film with water in the air can be prevented, thereby increasing reliability and affording greater manufacturing flexibility.

This application contains subject matter related to that disclosed in Korean priority application entitled "DUAL DAMASCENE INTERCONNECTION IN SEMICONDUCTOR DEVICE AND METHOD OF FABRICATING THE SAME" filed in the Korean Industrial Property Office on Dec. 31, 2003 and there duly assigned Ser. No. 10-2003-0101809, the entire contents of which being incorporated herein by reference.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a dual damascene interconnection in a semiconductor device, comprising the steps of:
    forming an etch stop film and an intermetal insulating film sequentially on a lower metal interconnection film, said intermetal insulating film being formed with a FSG film;
    forming a via hole so as to expose the etch stop film on the intermetal insulating film by performing an etching process using a mask pattern for via hole formation;
    forming a trench by performing an etching process using a mask pattern for trench formation;
    forming an insulating film on an exposed surface of the etch stop film and a surface of the intermetal insulating film;
    forming first and second insulative spacer films with a USG material on sidewalls of the via hole and the trench, respectively, by performing an etching process for the insulating film, and exposing a portion of the etch stop film;
    exposing the lower metal interconnection film by removing the exposed portion of the etch stop film;
    forming a barrier metal layer on the first and second insulative spacer films; and
    forming an upper metal interconnection film on the barrier metal layer, the via hole and the trench being filled with the upper metal interconnection film.

2. The method of claim 1, wherein, the step of forming the first and second insulative spacer films with a USG material includes forming a USG film at a maximal thickness of 300 .ANG.

3. The method of claim 1 wherein, the step of forming a barrier metal layer includes forming a Ta/TaN film.

4. The method of claim 1, wherein the step of performing an etching process for the insulating film includes using a plasma dry etching process.

* * * * *